United States Patent
Doong et al.

(10) Patent No.: US 11,037,805 B2
(45) Date of Patent: Jun. 15, 2021

(54) WAFER CLEANING APPARATUS AND METHOD OF CLEANING WAFER

(71) Applicant: NANYA TECHNOLOGY CORPORATION, New Taipei (TW)

(72) Inventors: Shyue-Ru Doong, Taipei (TW); Feng-Ju Tsai, Zhubei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 78 days.

(21) Appl. No.: 16/268,832

(22) Filed: Feb. 6, 2019

(65) Prior Publication Data

US 2020/0168483 A1 May 28, 2020

Related U.S. Application Data

(60) Provisional application No. 62/770,932, filed on Nov. 23, 2018.

(51) Int. Cl.
*H01L 21/67* (2006.01)
*B08B 3/10* (2006.01)
(Continued)

(52) U.S. Cl.
CPC ........ *H01L 21/67057* (2013.01); *B08B 3/102* (2013.01); *B08B 3/123* (2013.01); *H01L 21/02057* (2013.01)

(58) Field of Classification Search
CPC ........... B08B 3/041; B08B 3/102; B08B 3/12; B08B 3/123; B08B 3/048;
(Continued)

(56) References Cited

U.S. PATENT DOCUMENTS 4,736,758 A * 4/1988 Kusuhara ............... B01D 12/00
134/105
5,341,825 A * 8/1994 Kobayashi ........ H01L 21/67057
134/114
(Continued)

FOREIGN PATENT DOCUMENTS

CN 202506651 U 10/2012
CN 203124337 U 8/2013
(Continued)

*Primary Examiner* — Mikhail Kornakov
*Assistant Examiner* — Richard Z. Zhang
(74) *Attorney, Agent, or Firm* — Muncy, Geissler, Olds & Lowe, P.C.

(57) ABSTRACT

The present disclosure provides a wafer cleaning apparatus and a cleaning method. The wafer cleaning apparatus includes a tank and a wafer holder. The tank includes a bottom wall, a lateral wall, and a partition wall. The lateral wall is connected to the bottom wall. The partition wall is movably mounted on the lateral wall and divides a cleaning space defined by the bottom wall and the lateral wall into a first compartment and a second compartment. A passage communicating with the first compartment and the second compartment is formed when the partition wall is moved away from the bottom wall and immersed in a cleaning fluid received in the cleaning space. The wafer holder is adapted to be immersed in the cleaning fluid and to move between the first compartment and the second compartment. The present disclosure further provides a method of cleaning the wafer.

9 Claims, 12 Drawing Sheets

(51) Int. Cl.
*B08B 3/12* (2006.01)
*H01L 21/02* (2006.01)
(58) Field of Classification Search
CPC ....... H01L 21/67057; H01L 21/67017–67057; H01L 21/67086; H01L 21/6715; H01L 21/67253; H01L 21/02041–02076; Y10T 137/86212; Y10S 134/902
USPC .................. 134/114, 137, 154, 182, 183
See application file for complete search history.

(56) References Cited

U.S. PATENT DOCUMENTS

2008/0251108 A1* 10/2008 Nagai ................. B08B 3/08
134/56 R
2016/0254170 A1* 9/2016 Hu ..................... B08B 3/102
134/1.3

FOREIGN PATENT DOCUMENTS

| TW | 444290 B | 7/2001 |
|---|---|---|
| TW | 587276 B | 5/2004 |
| TW | 201501190 A | 1/2015 |

* cited by examiner

WAFER CLEANING APPARATUS AND METHOD OF CLEANING WAFER

PRIORITY CLAIM AND CROSS-REFERENCE

This application claims the priority benefit of U.S. provisional application Ser. No. 62/770,932, filed on Nov. 23, 2018. The entirety of the above-mentioned patent application is hereby incorporated by reference herein and made a part of this specification.

TECHNICAL FIELD

The present disclosure relates to a cleaning apparatus and a cleaning method, and more particularly, to a wafer cleaning apparatus and a method of cleaning a wafer by immersing the wafer in a cleaning fluid.

DISCUSSION OF THE BACKGROUND

In semiconductor fabrication, various layers of insulating material, semiconducting material and conducting material are formed to produce a multilayer semiconductor device. The layers are patterned to create features that, when combined, form elements such as transistors, capacitors and resistors. These elements are then interconnected to achieve a desired electrical function, thereby producing an integrated circuit (IC) device. The formation and patterning of the various device layers are achieved using conventional fabrication techniques, such as oxidation, implantation, deposition, epitaxial growth of silicon, lithography, etching and planarization.

A critical condition in semiconductor manufacturing is the absence of contaminants on the wafer processing surface, as contaminants including, for example, microscopic particles may interfere with and adversely affect subsequent processing steps leading to device degradation and ultimately semiconductor wafer rejection.

In order to maintain the cleanliness of the wafer processing surface and eliminate the contaminants deposited on the wafer processing surface during the processing steps, a cleaning process is required to be performed to the wafer processing surface after each of the processing steps.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a wafer cleaning apparatus. The wafer cleaning apparatus includes a tank and a wafer holder. The tank includes a bottom wall, a lateral wall, and a partition wall. The lateral wall is connected to the bottom wall. The partition wall is movably mounted on the lateral wall and divides a cleaning space defined by the bottom wall and the lateral wall into a first compartment and a second compartment. A passage communicating with the first compartment and the second compartment is formed when the partition wall is moved away from the bottom wall. The passage is immersed in a cleaning fluid received in the cleaning space during a wafer cleaning process. The wafer holder is adapted to be immersed in the cleaning fluid and to move between the first compartment and the second compartment.

In some embodiments, the second compartment is adjacent to the first compartment.

In some embodiments, the wafer cleaning apparatus further includes at least one controller electrically coupled to the wafer holder and the partition wall, wherein the wafer holder may be vertically and horizontally movable in response to the control of the controller, and the partition wall is movable with respect to the bottom wall in response to the control of the controller.

In some embodiments, the wafer cleaning apparatus further includes a fluid supply unit and a fluid return unit; the fluid supply unit is disposed on the tank and electrically coupled to the controller, wherein the fluid supply unit is configured to provide the cleaning fluid to the tank, and the fluid return unit is disposed on the tank and electrically coupled to the controller, wherein the fluid return unit is configured to drain the cleaning fluid from the tank.

In some embodiments, the wafer cleaning apparatus further includes at least one sensor disposed on the tank and electrically coupled to the controller, wherein the sensor is configured to detect a contamination level and a liquid level of the cleaning fluid.

In some embodiments, the wafer cleaning apparatus further includes an agitation generator attached to the bottom wall configured to agitate the cleaning fluid.

In some embodiments, the wafer cleaning apparatus further includes a gas provider placed in the cleaning space and configured to provide air bubbles into the cleaning fluid.

In some embodiments, the bottom wall, the lateral wall, and the partition wall are made of a corrosion-resistant material.

In some embodiments, the first compartment and the second compartment have substantially the same volume.

Another aspect of the present disclosure provides a method of cleaning a wafer. The method includes steps of supplying a cleaning fluid to a tank, the tank comprising a movable partition wall for separating the tank into a first compartment and a second compartment; placing the wafer in a wafer holder adapted to transfer the wafer between the first compartment and the second compartment, wherein is the wafer holder is initially positioned in the first compartment; immersing the partition wall into the wall and immersing the wafer into the cleaning fluid in the first compartment; lifting a portion of the partition wall for communicating the first compartment to the second compartment; transferring the wafer from the first compartment to the second compartment; and moving the wafer out of the cleaning fluid from the second compartment.

In some embodiments, the method further includes steps of resting the wafer in the cleaning fluid for a presetting time before the lifting of the portion of the partition wall; and immersing the portion of the partition wall into the cleaning fluid after the wafer is transferred to the second compartment.

In some embodiments, the method further includes a step of agitating the cleaning fluid to generate an agitated cleaning fluid before resting the wafer in the cleaning fluid.

In some embodiments, the cleaning fluid is agitated at an ultrasonic frequency.

In some embodiments, the method further includes a step of providing air bubbles in the cleaning fluid before resting the wafer in the cleaning fluid.

In some embodiments, the method further includes steps of detecting a contamination level of the liquid; and draining the cleaning fluid from the tank when the contamination level reaches a maximum level.

In some embodiments, the method further includes steps of detecting a liquid level of the cleaning fluid; and adding new cleaning fluid when the liquid level is lower than the partition wall.

The present disclosure provides a method of cleaning a wafer, which can effectively prevent contaminating particles left in the cleaning fluid from re-adhering to the wafer so as to improve wafer yield and reliability.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
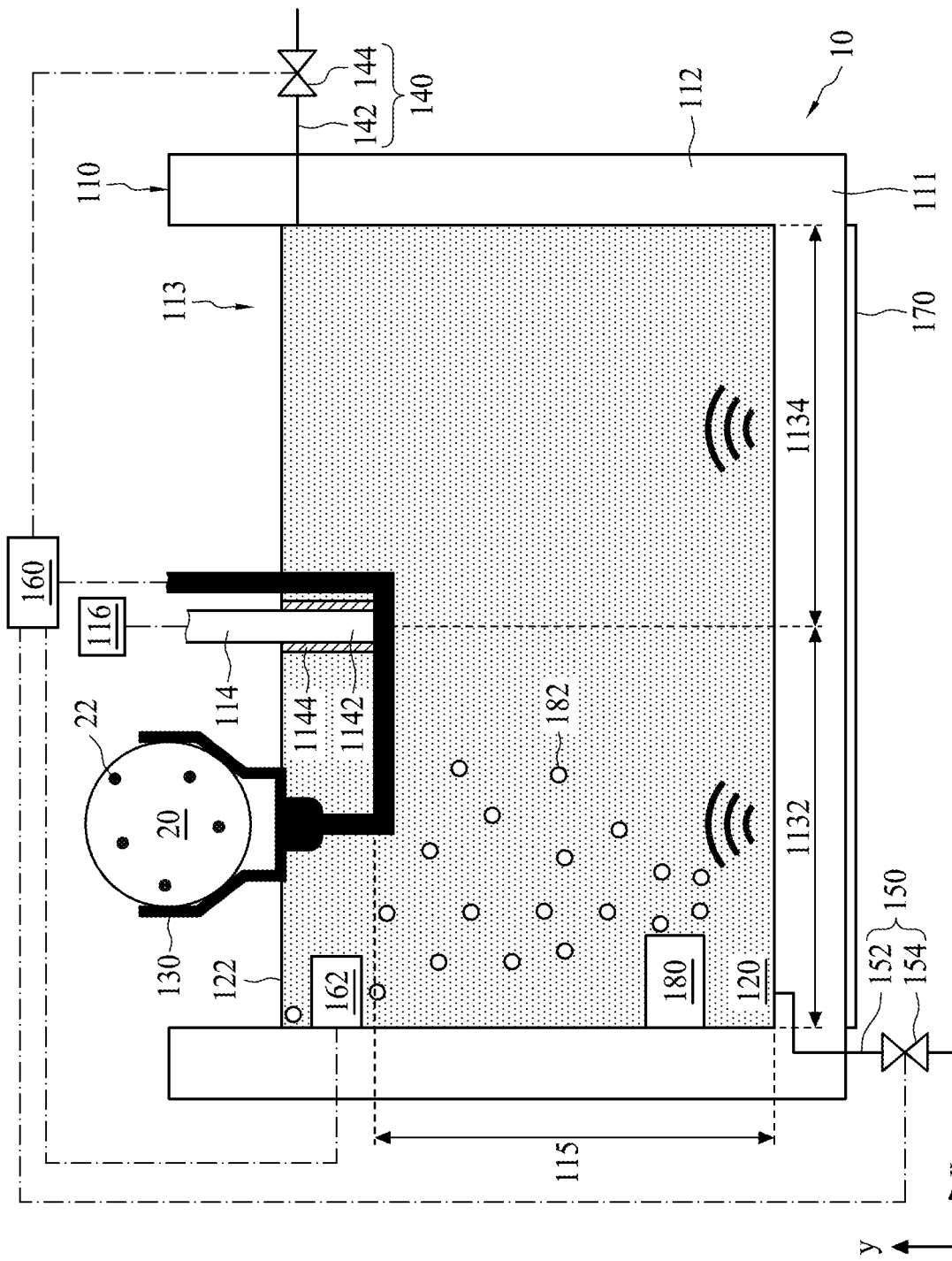
FIG. 1 is a schematic view of a cleaning apparatus, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a schematic view of a wafer cleaning apparatus 10 in accordance with some embodiments of the present disclosure. Referring to FIG. 1, the cleaning apparatus 10 is configured to clean one or more wafers 20 for removing contaminating particles 22 adhering to the wafers 20. The cleaning apparatus 10 includes a tank 110 filled with a cleaning fluid 120, a wafer holder 130 configured to hold and secure the wafer 20 which is to be cleaned, a fluid supply unit 140 providing the cleaning fluid 120 to the tank 110, and a fluid return unit 150 configured to drain the cleaning fluid 120 from the tank 110.

In some embodiments, the wafer 20 may be made of silicon or other semiconductor materials, such as germanium (Ge). In some embodiments, the wafer 20 includes an epitaxial layer. For example, the wafer 20 has an epitaxial layer overlying a bulk semiconductor. In some embodiments, the wafer 20 may have various device elements. Examples of device elements that are formed in the wafer 20 include transistors, diodes, and/or other applicable elements. Various processes are performed to form the device elements, such as deposition, etching, implantation, photolithography, annealing, and/or other suitable processes.

Figure 2:
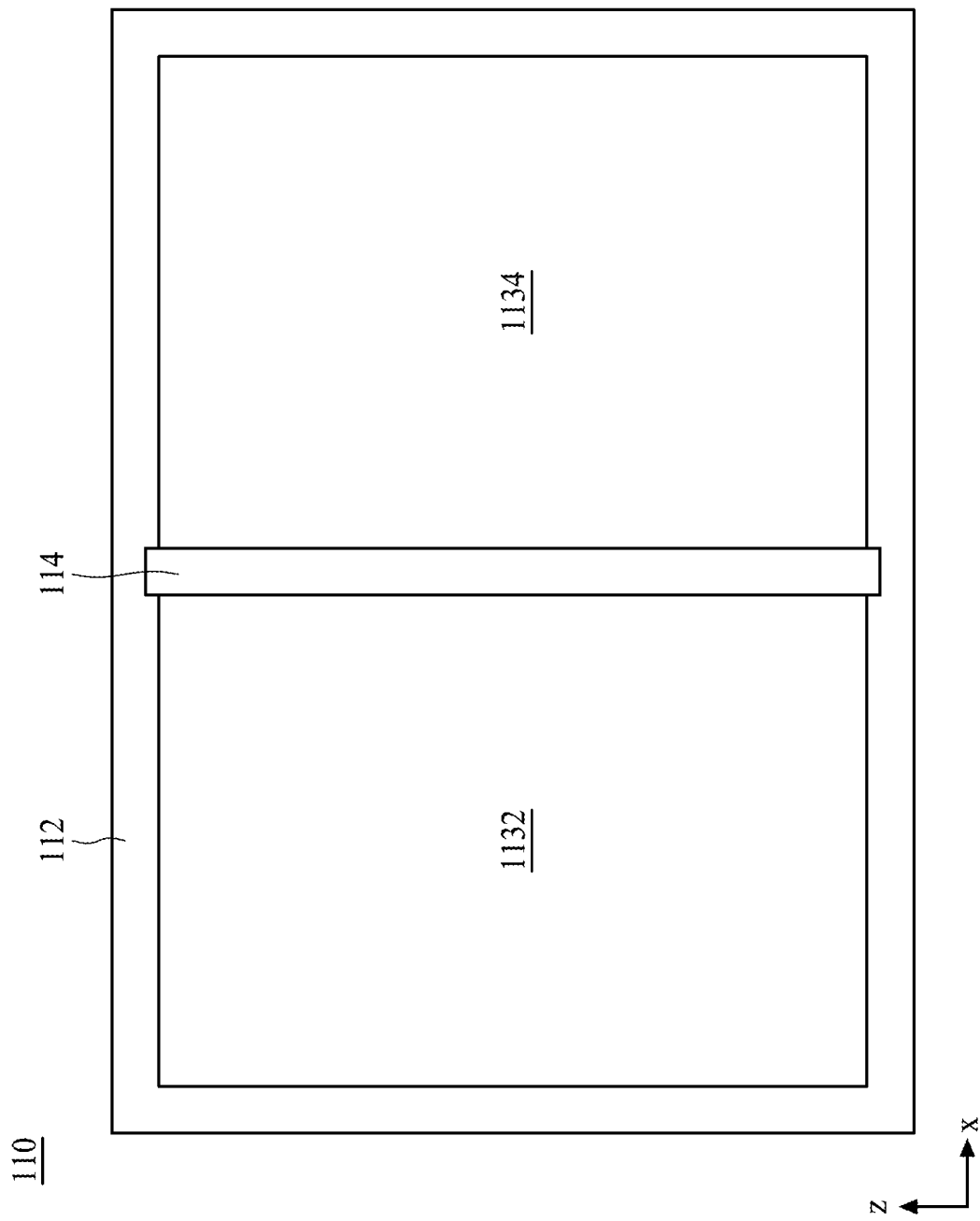
FIG. 2 is a top view of a tank shown in FIG. 1, in accordance with some embodiments of the present disclosure.

FIG. 2 is a top view of the tank 110 shown in FIG. 1 in accordance with some embodiments of the present disclosure. Referring to FIGS. 1 and 2, in some embodiments, the tank 110 includes a bottom wall 111 and a lateral wall 112 connected to the bottom wall 111 and extending away from the bottom wall 111. As a result, a cleaning space 113 for receiving the cleaning fluid 120 is defined by the bottom wall 111 and the lateral wall 112.

In some embodiments, the tank 110 further includes a partition wall 114 slidably mounted on the lateral wall 112 and adapted to slide with respect to the bottom wall 111 during a wafer cleaning process. In some embodiments, the partition wall 114 divides the cleaning space 113 into a first compartment 1132 and a second compartment 1134. In some embodiments, the second compartment 1134 is adjacent to the first compartment 1132. In some embodiments, the first compartment 1132 and the second compartment 1134 have substantially the same volume. In some embodiments, a bottom end 1142 of the partition wall 114 is immersed in the cleaning fluid 120 to block the topmost cleaning fluid 120 from the first compartment 1132 to flow into the second compartment 1134. In some embodiments, the bottom end 1142 of the partition wall 114 is placed at a position no higher than a liquid surface 122 of the cleaning fluid 120. In some embodiments, the bottom wall 111, the lateral wall 112, and the partition wall 114 of the tank 110 are made of a corrosion-resistant material such as stainless steel, aluminum or quartz. In some embodiments, the partition wall 114 is vertically movable in response to a first controller 116. In some embodiments, the partition wall 114 is moved to control the opening or closing of a passage 115 between the first compartment 1132 and the second compartment 1134, wherein the passage 115 is submerged in the cleaning fluid during the wafer cleaning process. In some embodiments, the wafer holder 130 is moved between the first compartment 1132 and the second compartment 1134 through the passage 115. In some embodiments, the first controller 116 may be a personal computer, a notebook computer, an industrial computer, a processor, or other devices capable of computation.

Referring again to FIG. 1, in some embodiments, the wafer holder 130 is adapted to be immersed in the cleaning fluid 120 and to move between the first compartment 1132 and the second compartment 1134. In some embodiments, the wafer holder 130 can be vertically and horizontally movable in response to the control of a second controller 160. As a result, the wafer 100 is capable of being immersed in the cleaning fluid 120 and can be transferred from the first compartment 1132 to the second compartment 1134. In some embodiments, the second controller 160 may be a personal computer, a notebook computer, an industrial computer, a processor, or other devices capable of computation. In some embodiments, the partition wall 114 and the wafer holder 130 may be coupled to the same controller.

In some embodiments, the fluid supply unit 140 is connected to the lateral wall 112 distal from the bottom wall 111 and configured to provide the cleaning fluid 120 to the tank 110. In some embodiments, the fluid supply unit 140 includes an inlet line 142 communicating with the cleaning space 113 and an inlet valve 144 disposed on the inlet line 142 and used to regulate the flow of the cleaning fluid 120 from a fluid source (not shown) in response to the control of the second controller 160. In some embodiments, the cleaning fluid 120 is added to the tank 110 from the second compartment 1134 to block the contaminating particles 22 in the first compartment 1132 from flowing into the second compartment 1134.

In some embodiments, the fluid return unit 150 is connected to the bottom wall 111. In some embodiments, the fluid return unit 150 includes an outlet line 152 communicating with the cleaning space 113 and an outlet valve 154 disposed on the outlet line 152 and regulating the flow of the cleaning fluid 120 from the tank 110 to a waste processing unit (not shown) in response to the control of the second controller 160. In some embodiments, the cleaning fluid 120 containing the contaminating particles 22 is drained away through the fluid return unit 150.

In some embodiments, the second controller 160 connected to the inlet valve 144 and the outlet valve 154 is configured to control the inlet valve 144 and the outlet valve 154 according to the predetermined setting. For example, the inlet valve 144 and the outlet valve 154 may be activated by the second controller 160 when a contamination level of the cleaning fluid 120 is higher than a maximum level or the liquid level of the cleaning fluid 120 is lower than the bottom end 1142 of the partition wall 114.

In some embodiments, the contamination level and the liquid level of the cleaning fluid 120 may be detected by at least one sensor 162 disposed on the tank 110 and electrically connected to the second controller 160. In some embodiments, the sensor 162 is configured to monitor the contamination level and the liquid level of the cleaning fluid 120 and generate a detecting signal to trigger the second controller 160 to activate the inlet valve 144 and/or the output valve 154 when the contamination level reaches the maximum level or the bottom end 1142 of the partition wall 114 is not submerged in the cleaning fluid 120. In some embodiments, the sensor 162 is disposed on the lateral wall 112 in the first compartment 1132, where the wafer 20 to be cleaned is initially placed. In some embodiments, the sensor 162 and the bottom end 1142 of the partition wall 114 may be disposed at the same horizontal level during a detecting procedure is performed.

In some embodiments, the sensor 162 may generate the detecting signal to trigger the second controller 160 when reflectance levels (or transmittance levels) of the cleaning fluid 120 are not in a desired range. For example, if the reflectance of the cleaning fluid 120 is less than the desired range, indicating that the contamination level of the cleaning fluid 120 is higher than the maximum level, the second controller 160 opens the outlet valve 154 to drain the cleaning fluid 120 from the tank 110, and then the second controller 160 closes the outlet valve 154 and opens the inlet valve 144 to add the cleaning fluid 120 to the tank 110. In some embodiments, if the reflectance of the cleaning fluid 120 is greater than the desired range, indicating that the bottom end 1142 of the partition wall 114 is not submerged in the cleaning fluid 120; therefore, the second controller 160 opens the inlet valve 144 to add the cleaning fluid 120 to the tank 110. In some embodiments, the sensors 162 may perform the detecting procedure, and the inlet valve 144 and/or the outlet valve 154 may be activated by the second controller 160 after the wafer 20 is moved away from the cleaning fluid 120. In some embodiments, the bottom end 1142 of the partition wall 114 may be coated with a reflector 1144 to improve detecting accuracy. In some embodiments, the reflector 1144 is made of corrosion-resistant material.

In some embodiments, the cleaning apparatus 10 further includes at least one agitation generator 170 located outside of the tank 110 and attached to the bottom wall 111. In some embodiments, the agitation generator 170 is capable of agitating the cleaning fluid 120 at a predetermined frequency, which may be in a range from about 20 KHz to about 100 KHz. Due to the ultrasonic agitation of the cleaning fluid 120, the contaminating particles 22 adhering to the wafer 20 are shaken away from the wafer 20 and dispersed in the cleaning fluid 120 held by the tank 100. In some embodiments, the frequency of oscillation of the agitation generator 170 may be varied according to the size of the contaminating particles 22. For example, if the contaminating particles 22 have a relatively large size, the cleaning fluid 120 is oscillated at a low frequency, so that the cleaning efficiency is enhanced.

In some embodiments, the cleaning apparatus 10 may further include at least one gas provider 180 placed in the cleaning space 113. In some embodiments, the gas provider 180 is placed on the lateral wall 112 of the tank 110; however, the gas provider 180 may be placed in any position in the cleaning space 113 as long as the gas provider 180 can be immersed in the cleaning fluid 120. In some embodiments, the gas provider 180 is placed in the first compartment 1132 where the wafer 20 to be cleaned is initially placed.

In some embodiments, the gas provider 180 is configured to provide air bubbles 182 or a compressed air stream (not shown) utilized to remove the contaminating particles 22 adhering to the wafer 20 into the cleaning fluid 120 and guide the contaminating particles 22 dispersed in the cleaning fluid 120 upward to prevent the contaminating particles 22 from flowing into the second compartment 1134. In some embodiments, the flow rate of the air bubbles 182 or the compressed air stream provided by the gas provider 180 may be adjusted according to the size of the contaminating particles 22 or according to the contamination level of the cleaning fluid 120. For example, the gas provider 180 may increase the flow rate of the air bubbles 182 when the contamination level increases to enhance the cleaning efficiency.

In some embodiments, the cleaning apparatus 10 may include two or more gas providers 180 respectively placed in the first compartment 1132 and the second compartment 1134, and the flow rates of the gas providers 180 are different. For example, the gas provider 180 placed in the first compartment 1132 is adjusted to flow at the flow rate higher than the gas provider placed in the second compartment 1134, so that the cleaning efficiency in the first compartment 1132 is enhanced.

Figure 3:
FIG. 3 is a flow diagram of a method for cleaning a wafer, in accordance with some embodiments of the present disclosure.

FIG. 3 is a flow diagram illustrating a method 300 of cleaning a wafer 20 in accordance with some embodiments of the present disclosure. FIGS. 4 to 12 are schematic diagrams of cleaning stages of a process for cleaning a wafer 20 in a wafer cleaning apparatus 10 in accordance with some embodiments of the present disclosure.

Figure 4:
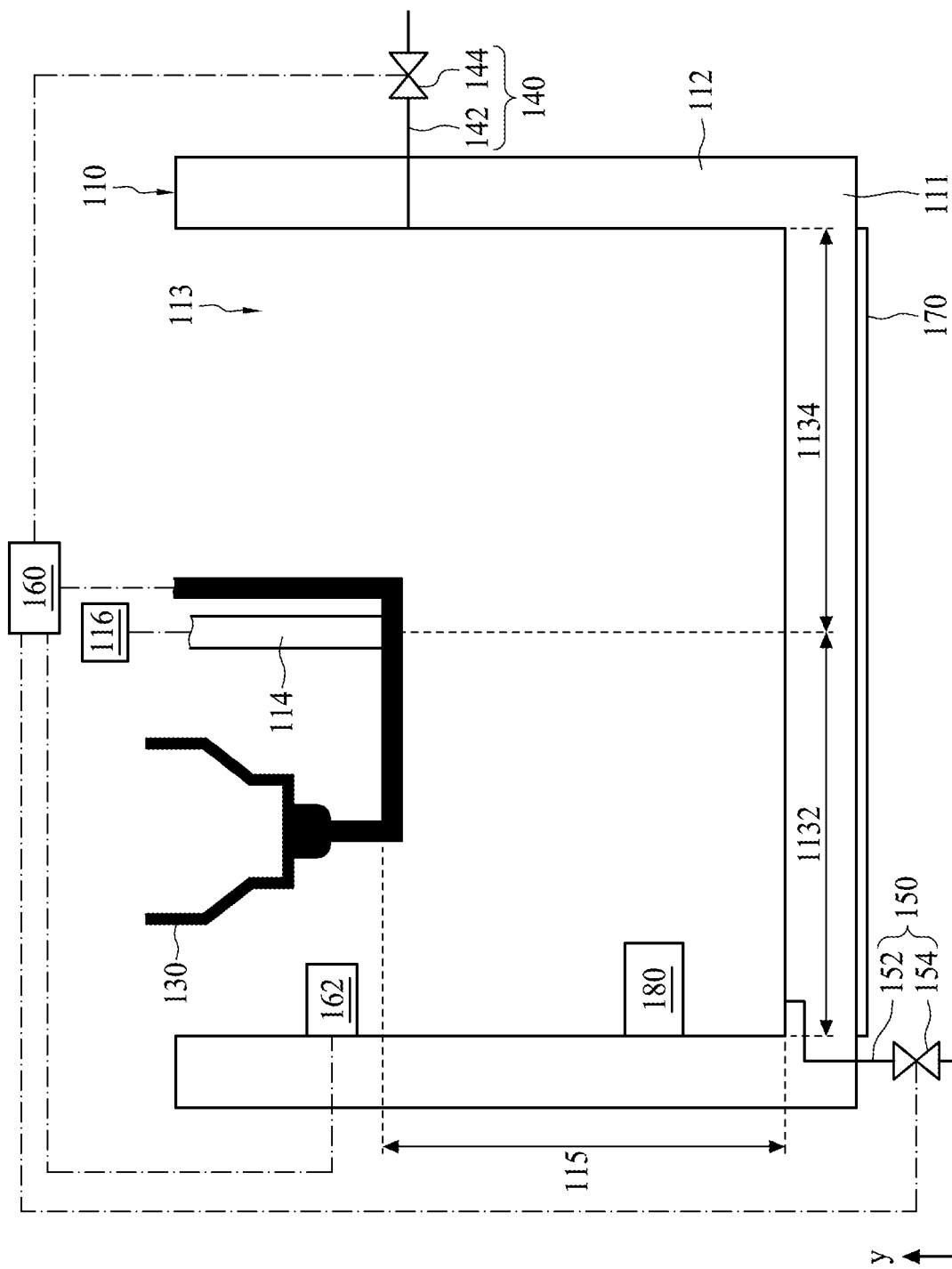
FIGS. 4 through 12 illustrate schematic diagrams of cleaning stages of a process for cleaning a wafer in a wafer cleaning apparatus, in accordance with some embodiments of the present disclosure.

Referring to FIG. 4, a tank 110 and a wafer holder 130 are provided according to a step 302 in FIG. 3. The tank 110 includes a partition wall 114 slidably mounted inside a cleaning space 113 of the tank 110 and separating the cleaning space 113 into a first compartment 1132 and a second compartment 1134 side-by-side and a passage 115 formed through a bottom portion of the partition wall 114, such that the first compartment 1132 can communicate with the second compartment 1134.

In some embodiments, the wafer holder 130 is movably disposed in the tank 100 and adapted to transfer a wafer between the first compartment 1132 and the second compartment 1134. In some embodiments, the wafer holder 130 is initially moved into the first compartment 1132 from the second compartment 1134 and then transfers the wafer 20 to the second compartment 1134 during the wafer cleaning process.

Figure 5:
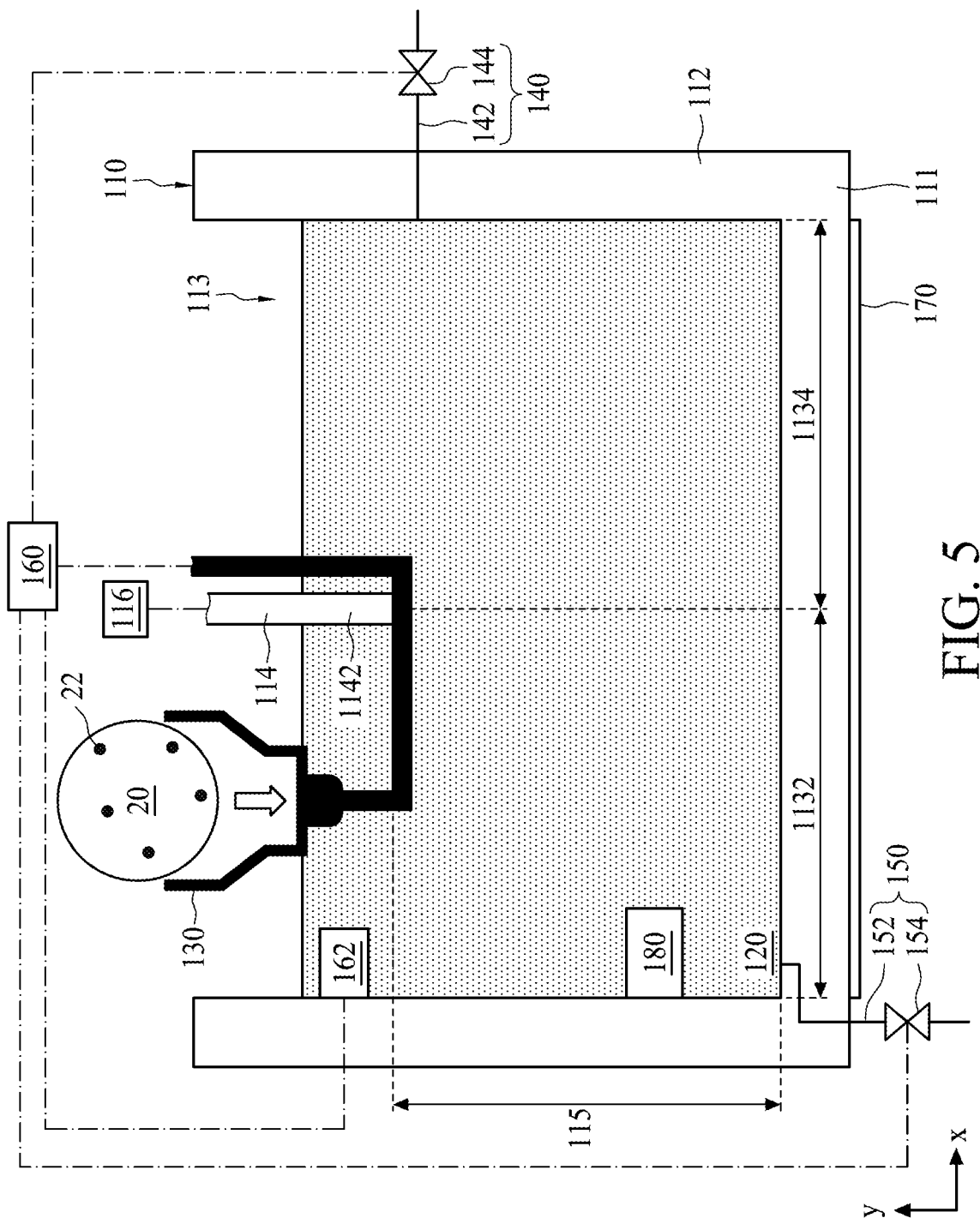

Referring to FIG. 5, in some embodiments, a cleaning fluid 120 is then supplied to the tank 110 until a portion of the partition wall 114 and the passage 115 are submerged in the cleaning fluid 120 according to a step 304 in FIG. 3. In some embodiments, the cleaning fluid 120 may be a chemical liquid or rinsing liquid. In some embodiments, the cleaning fluid 120 includes, but is not limited to, deionized water, $NH_4OH$ solution, $H_2O_2$ solution, HCl solution, or a combination thereof. In some embodiments, the cleaning fluid 120 is supplied by a fluid supply unit 140 disposed on a lateral wall 112 of the tank 110.

Next, a wafer 20 to be cleaned is provided on the wafer holder 130 according to a step 306 in FIG. 3. In some embodiments, the wafer holder 130 is configured to hold and secure the wafer 20 to be cleaned. In some embodiments, metal impurities (metal residue), minute dust or a natural oxide film (hereinafter referred to as contaminating particles 22) may adhere to the wafer 20.

Figure 6:
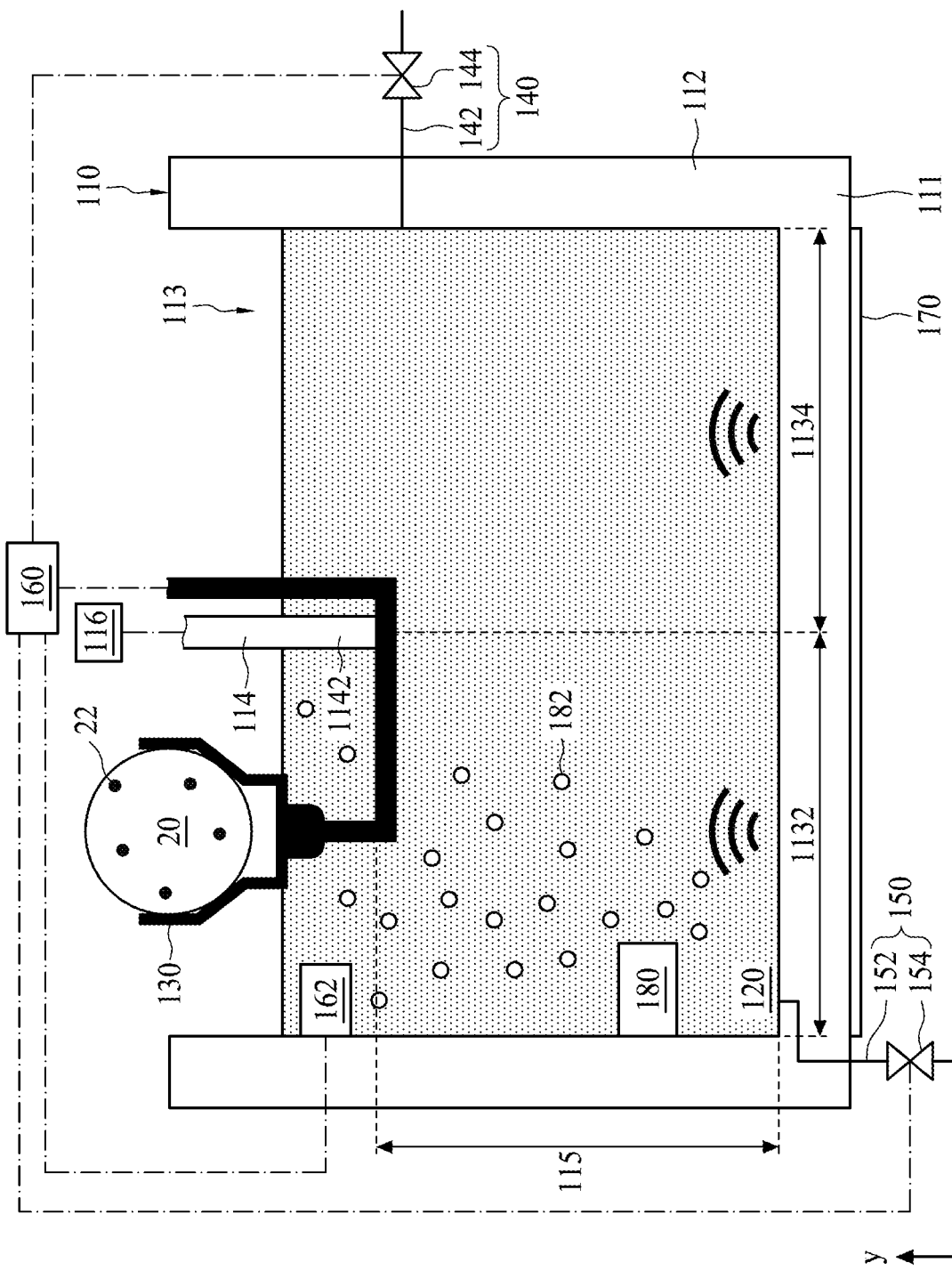

Referring to FIG. 6, in some embodiments, the cleaning fluid 120 is agitated according to a step 308 in FIG. 3. In some embodiments, the cleaning fluid 120 is agitated by an agitation generator 170 located outside the tank 110 and attached to a bottom wall 111 of the tank 110, wherein the lateral wall 112 is connected to the bottom wall 111 and extends away from the bottom wall 111. In some embodiments, the cleaning fluid 120 is agitated at an ultrasonic frequency.

Next, air bubbles 182 are provided into the cleaning fluid 120 according to a step 310 in FIG. 3. In some embodiments, the air bubbles 182 are generated by a gas provider 180 mounted on the lateral surface 112 of the tank 110. In some embodiments, the air bubbles 182 include noble gas. In some embodiments, the cleaning fluid 120 is agitated and the air bubbles 182 are provided into the cleaning fluid 120 before the wafer 20 is immersed into the cleaning fluid 120. In some embodiments, the cleaning fluid 120 is agitated and the air bubbles 182 are provided into the cleaning fluid 120 at the same time.

Figure 7:
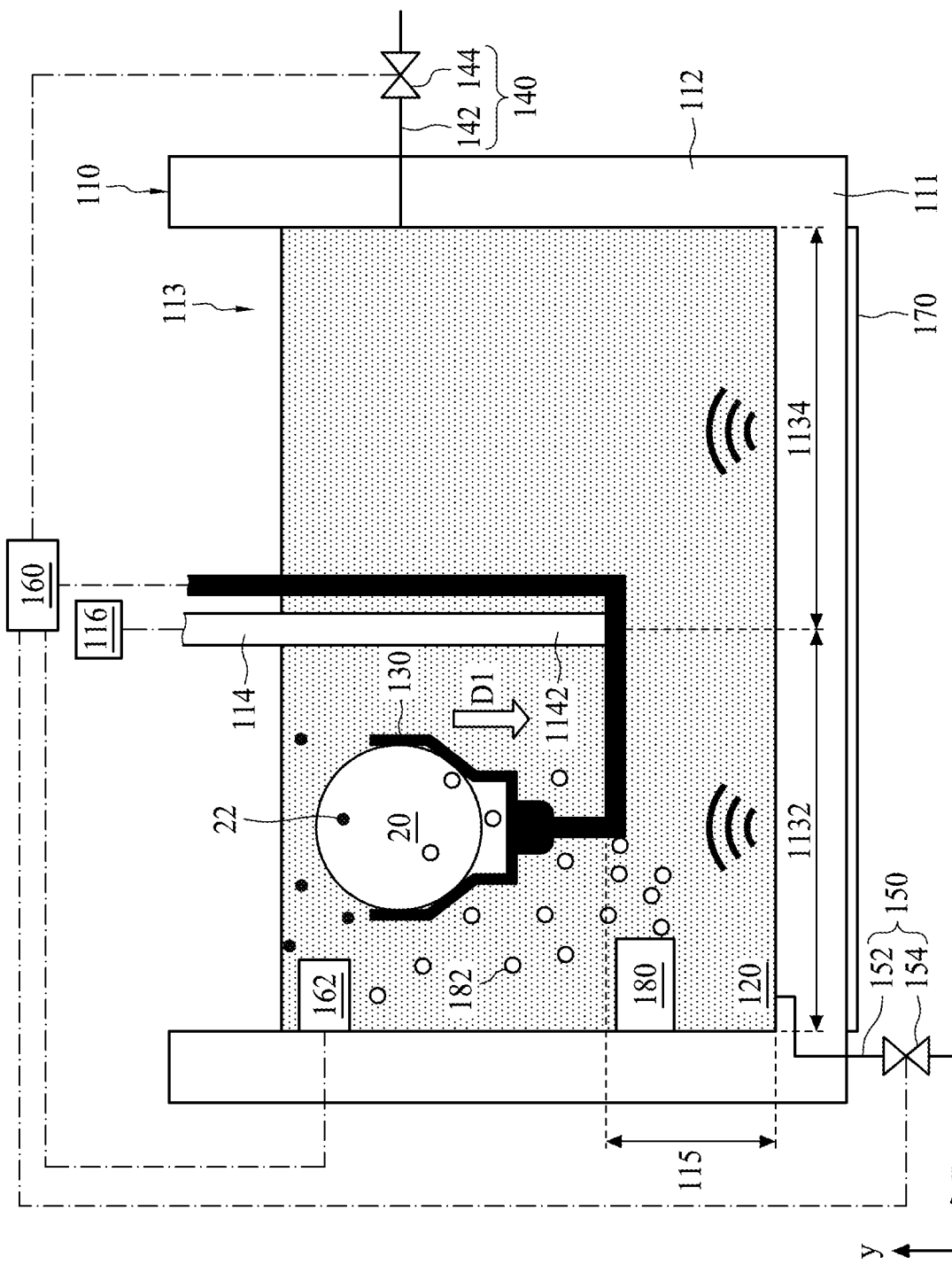

Referring to FIG. 7, in some embodiments, the wafer 20 is immersed in the cleaning fluid 120 in the first compartment 1132 according to a step 312 in FIG. 3. As a result, the contaminating particles 22, adhering to the wafer 20, are shaken away from the wafer 20 by the agitated cleaning fluid 120 and dispersed in the cleaning fluid 120. In some embodiments, the wafer 20 is vertically moved (in a direction D1) at a predetermined speed. In some embodiments, the partition wall 114 slides downward when the wafer 20 is vertically moved, such that the contaminating particles 22 can be effectively blocked by the partition wall 114. In some embodiments, the partition wall 114 may be slid at the predetermined speed. In some embodiments, a bottom end 1142 of the partition wall 114 is in contact with the wafer holder 130 to prevent the contaminating particles 22 dispersed in the cleaning fluid 120 from flowing to the second compartment 1134. In some embodiments, the contaminating particles 22 dispersed in the cleaning fluid 120 are guided upward by the air bubbles 182, such that the contaminating particles 22 can be blocked by the partition wall 114.

Figure 8:
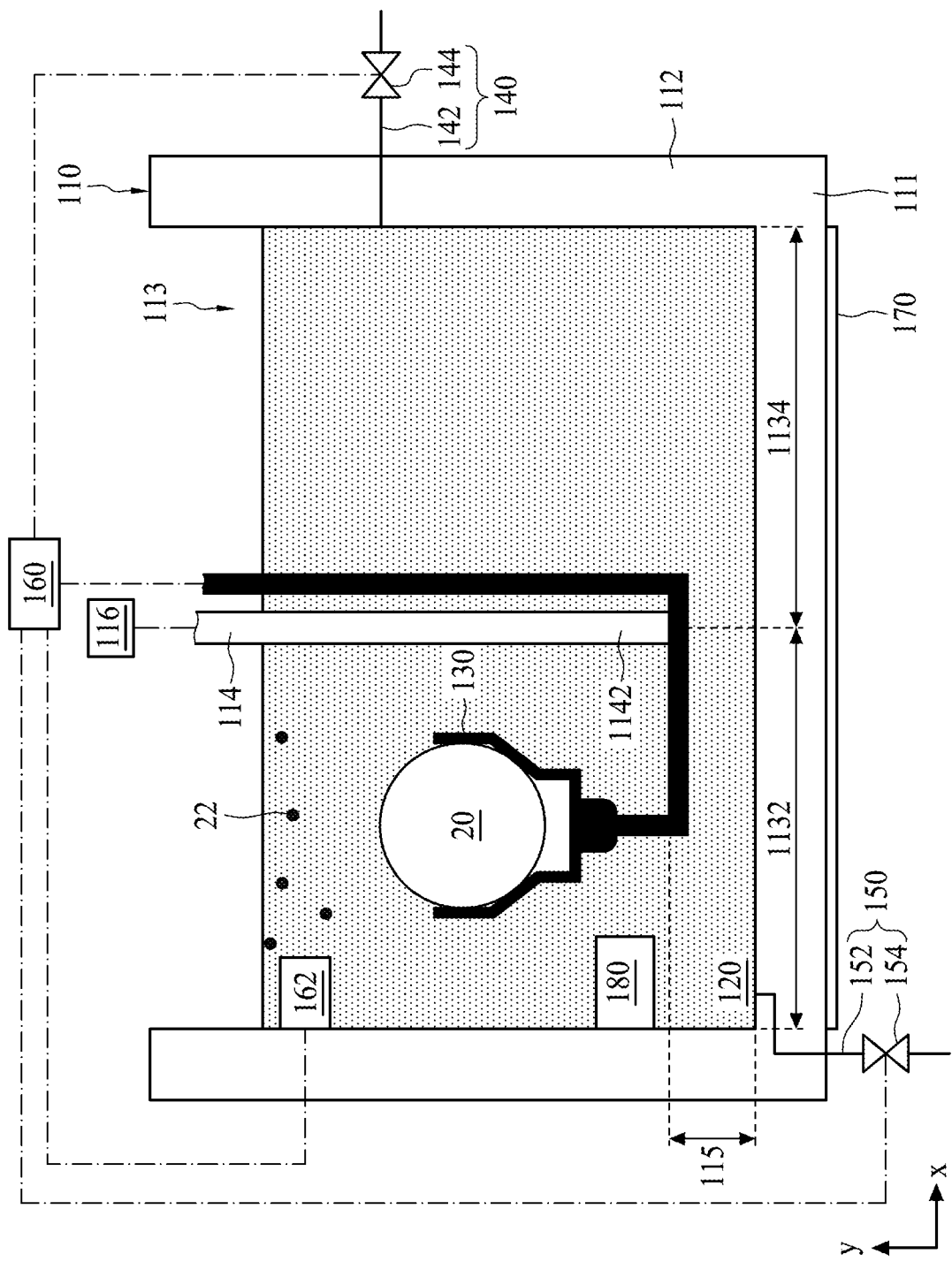

Referring to FIG. 8, in some embodiments, the agitation generator 170 stops agitating the cleaning fluid 120 and the gas provider 180 stops supplying the air bubbles 182 to rest the wafer 20 in the static cleaning fluid 120 for a presetting time according to a step 313 in FIG. 3, thereby preventing contaminating particles 22 from flowing into the second compartment 1134 when the partition wall 112 is lift. In some embodiments, in the presetting time, the wafer holder 130 may be in contact with the bottom wall 111.

Figure 9:
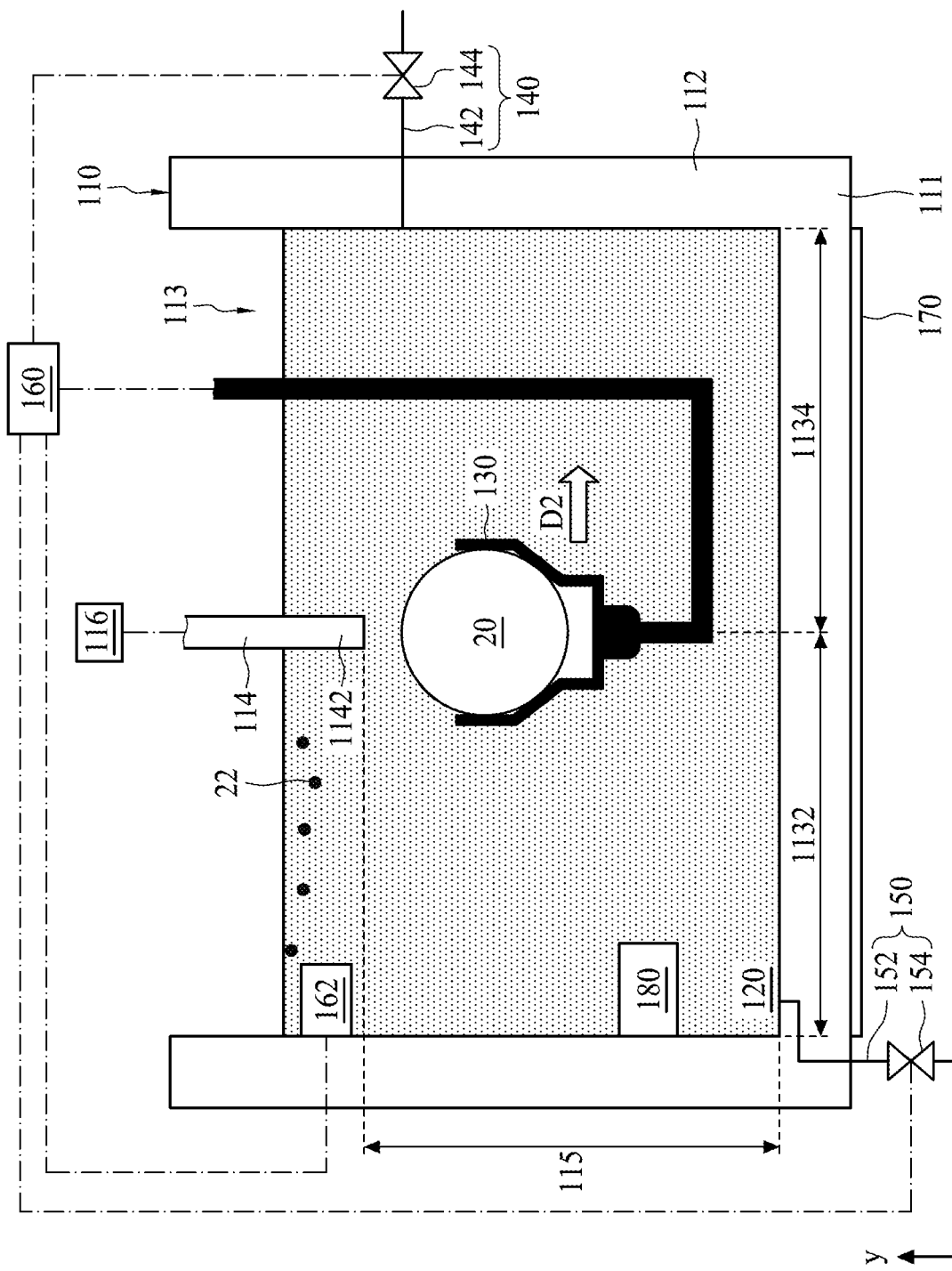

Referring to FIG. 9, in some embodiments, the partition wall 114 is slid upward after the presetting time and the wafer 20 is transferred from the first compartment 1132 to the second compartment 1134 according to a step 314 in FIG. 3. In some embodiments, the wafer holder 130 is slightly lifted from the bottom wall 111 and the wafer 20 is horizontally moved (in a direction D2) from the first compartment 1132 to the second compartment 1134 through the passage 115 at the predetermined speed.

Figure 10:
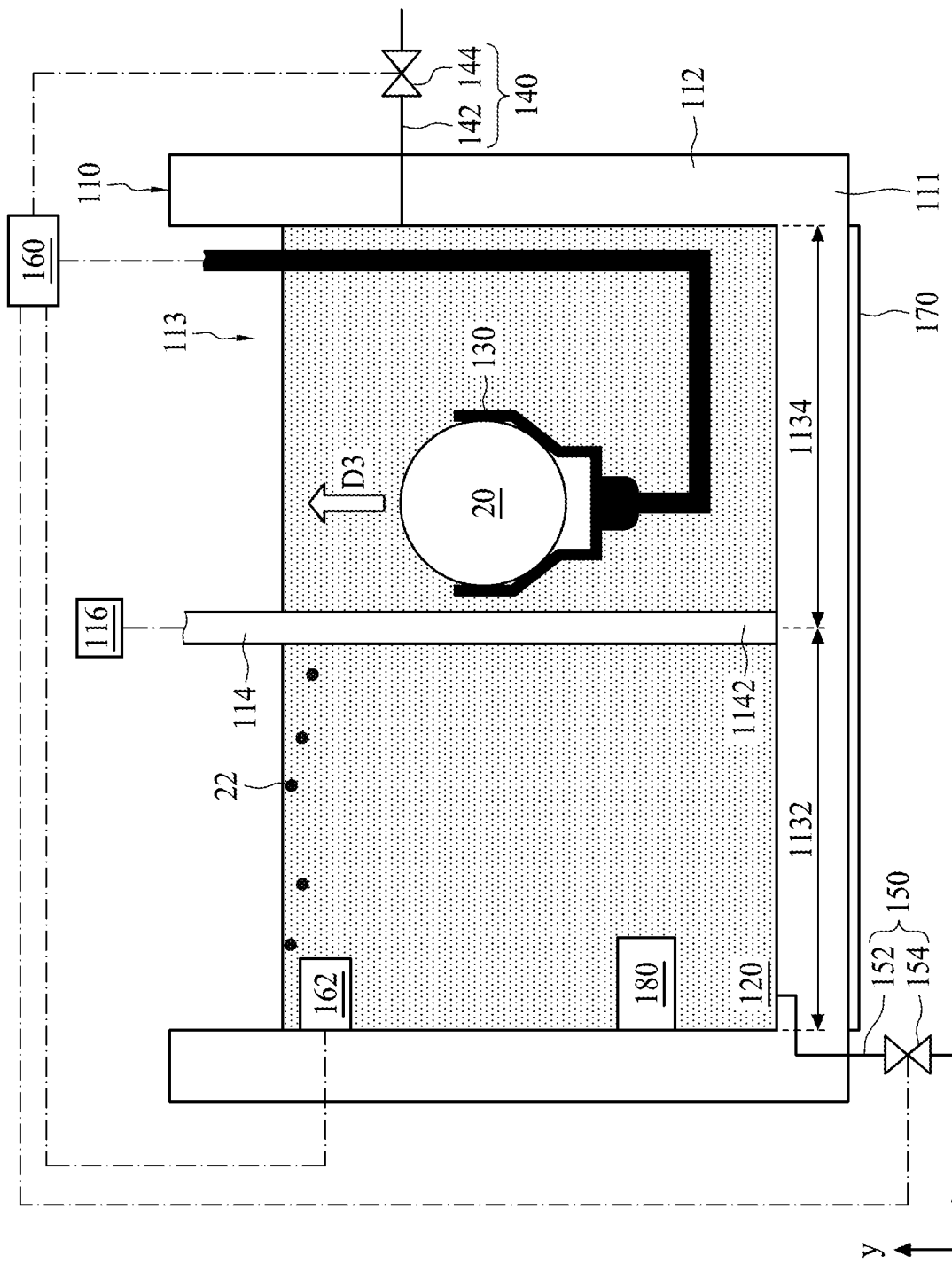
Figure 11:
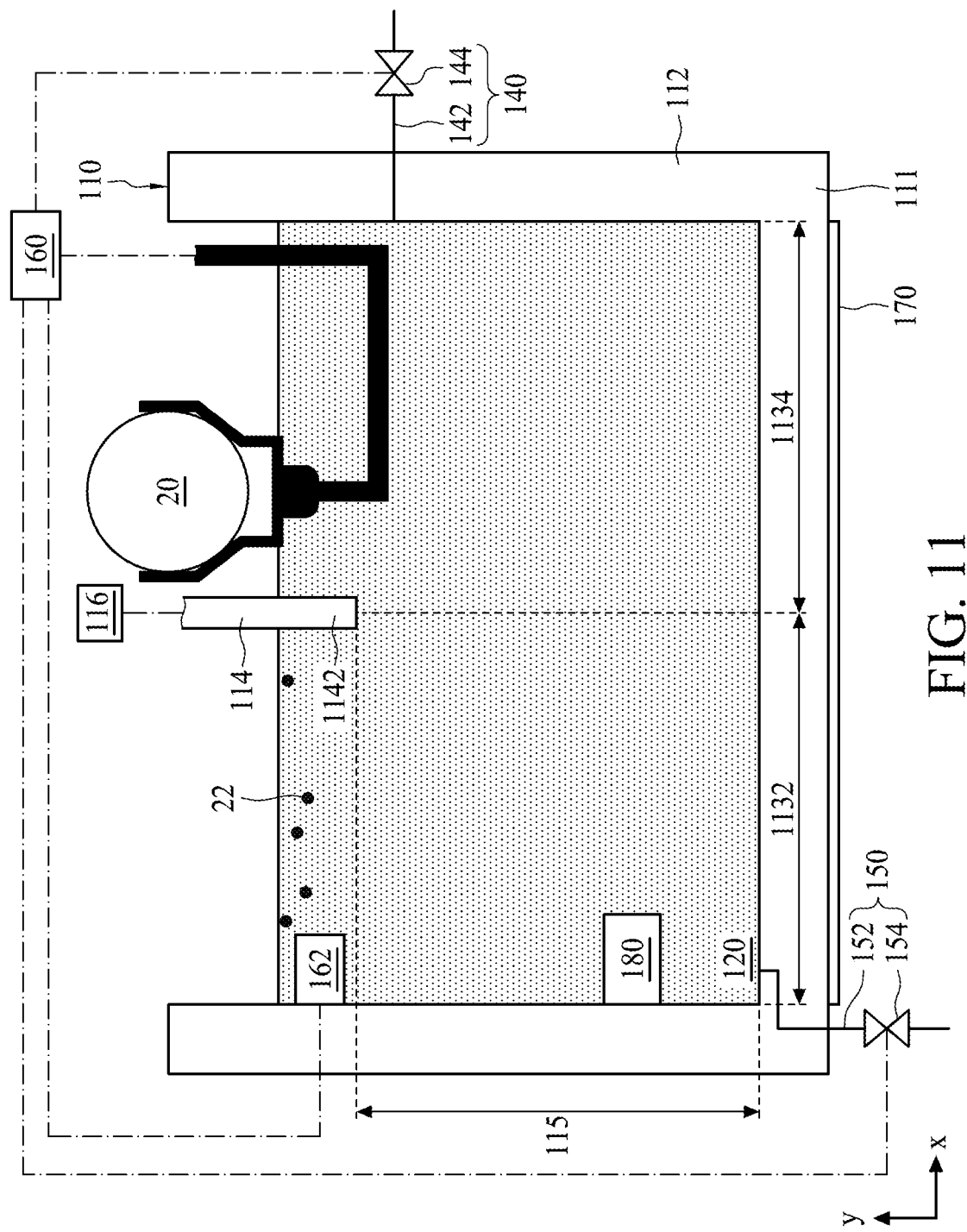

Referring to FIG. 10, in some embodiments, the wafer 20 is moved out of the cleaning fluid 120 in the second compartment 1134 according to a step 316 in FIG. 3. Accordingly, the wafer 20 is cleaned. In some embodiments, the wafer 20 is moved upward at the predetermined speed until it is above the liquid surface 122, as shown in FIG. 11. In some embodiments, after the wafer 20 is transferred to the second compartment 1134, the partition wall 114 is slid downward and in contact with the bottom wall 114, as shown in FIG. 10, to prevent the contaminating particles 22 dispersed in the first compartment 1132 from entering the second compartment 1134 during the wafer 20 is vertically moved in a third direction D3. In some embodiments, the partition wall 114 is slid upward after the wafer 20 is moved out of the cleaning fluid 20, as shown in FIG. 11.

Figure 12:
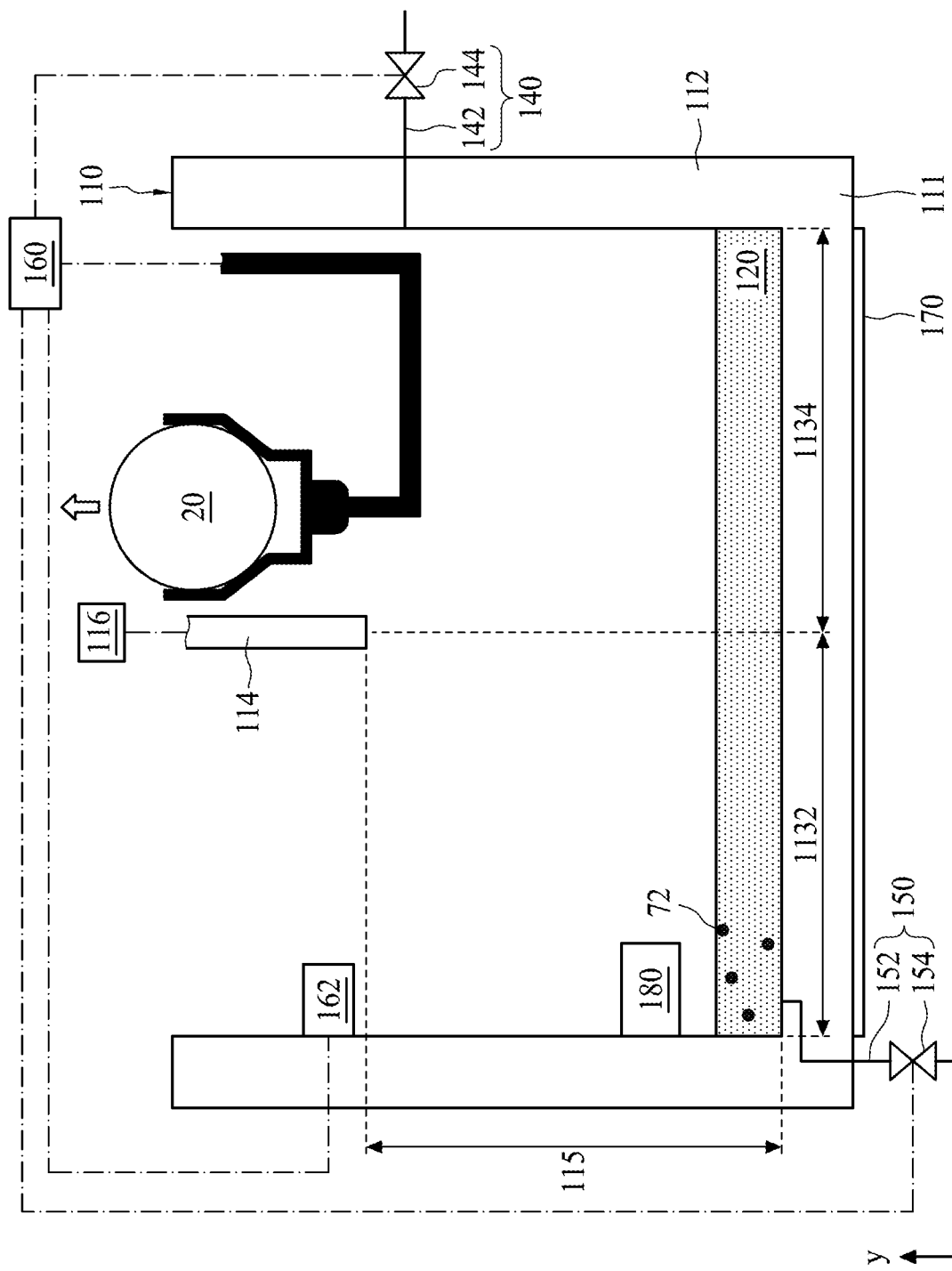

In some embodiments, after the wafer 30 is removed from the tank 110, a detecting procedure is performed to monitor a contamination level and a liquid level of the cleaning fluid 120 according to a step 318 in FIG. 3. In some embodiments, the cleaning fluid 120 containing contaminating particles 22 is drained away through a fluid return unit 150 when the contamination level reaches a maximum level, as shown in FIG. 12. In some embodiments, new cleaning fluid 120 is injected into the tank 110 when the liquid level of the cleaning fluid 120 is lower than the partition wall 114. In some embodiments, the detecting procedure is performed by at least one sensor 162 disposed on the lateral wall 112 of the tank 110.

In conclusion, the method of cleaning a wafer of the present disclosure can effectively prevent contaminating particles 22 left in the cleaning fluid 120 from re-adhering to the wafer 20, thereby improving wafer yield and reliability.

One aspect of the present disclosure provides a wafer cleaning apparatus. The wafer cleaning apparatus includes a tank and a wafer holder. The tank includes a bottom wall, a lateral wall, and a partition wall. The lateral wall is connected to the bottom wall. The partition wall is movably mounted on the lateral wall and divides a cleaning space defined by the bottom wall and the lateral wall into a first compartment is and a second compartment. A passage communicating with the first compartment and the second compartment is formed when the partition wall is moved away from the bottom wall, and the passage is immersed in a cleaning fluid received in the cleaning space during a wafer cleaning process. The wafer holder is adapted to be immersed in the cleaning fluid and to move between the first compartment and the second compartment.

One aspect of the present disclosure provides a method of cleaning a wafer. The method includes steps of supplying a cleaning fluid to a tank, the tank comprising a partition wall for separating the tank into a first compartment and a second compartment; placing the wafer on a wafer holder adapted to transfer the wafer between the first compartment and the second compartment, wherein the wafer holder is initially positioned in the first compartment; immersing the partition wall into the cleaning fluid and immersing the wafer into the cleaning fluid in the first compartment; lifting a portion of the partition wall for communicating the first compartment and the second compartment; transferring the wafer from the first compartment to the second compartment; and moving the wafer away from the cleaning fluid in the second compartment.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods and steps.

What is claimed is:

1. A wafer cleaning apparatus, comprising:
   a tank comprising a bottom wall, a lateral wall connected to the bottom wall, and a partition wall movably mounted on the lateral wall and dividing a cleaning space defined by the bottom wall and the lateral wall into a first compartment and a second compartment, wherein a passage communicating with the first compartment and the second compartment is formed when the partition wall is at a first position that the partition wall is moved away from the bottom wall, and the passage is immersed in a cleaning fluid received in the cleaning space during a wafer cleaning process, wherein the passage is closed to prevent the cleaning fluid from communicating between the first compartment and the second compartment when the partition wall is at a second position that the partition wall is slid downward and in contact with the bottom wall;
   a wafer holder adapted to be immersed in the cleaning fluid and to move between the first compartment and the second compartment;
   at least one controller electrically coupled to the partition wall, wherein the partition wall is movable with respect to the bottom wall in response to a control of the at least one controller;
   at least one sensor disposed on the tank and electrically coupled to the controller, wherein the at least one sensor is configured to detect a reflector coated on the partition wall.

2. The wafer cleaning apparatus of claim 1, wherein the second compartment is adjacent to the first compartment.

3. The wafer cleaning apparatus of claim 1, wherein the at least one controller is electrically coupled to the wafer holder, wherein the wafer holder is vertically and horizontally movable in response to a control of the at least one controller.

4. The wafer cleaning apparatus of claim 3, further comprising:
   a fluid supply unit disposed on the tank and electrically coupled to the at least one controller, wherein the fluid supply unit is configured to provide the cleaning fluid to the tank; and
   a fluid return unit disposed on the tank and electrically coupled to the at least one controller, wherein the fluid return unit is configured to drain the cleaning fluid from the tank.

5. The wafer cleaning apparatus of claim 4, wherein the at least one sensor is configured to detect a contamination level and a liquid level of the cleaning fluid.

6. The wafer cleaning apparatus of claim 1, further comprising an agitation generator located outside the tank and attached to the bottom wall, wherein the agitation generator is configured to agitate the cleaning fluid.

7. The wafer cleaning apparatus of claim 1, further comprising a gas provider placed in the cleaning space and configured to provide air bubbles into the cleaning fluid.

8. The wafer cleaning apparatus of claim 1, wherein the bottom wall, the lateral wall, and the partition wall are made of a corrosion-resistant material.

9. The wafer cleaning apparatus of claim 1, wherein the first compartment and the second compartment have substantially the same volume.

* * * * *